(12) United States Patent
Koo et al.

(10) Patent No.: US 7,498,605 B2
(45) Date of Patent: *Mar. 3, 2009

(54) FLAT PANEL DISPLAY

(75) Inventors: Jae-Bon Koo, Yongin-si (KR); Ji-Yong Park, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/897,108

(22) Filed: Jul. 23, 2004

(65) Prior Publication Data

US 2005/0017247 A1    Jan. 27, 2005

(30) Foreign Application Priority Data

Jul. 25, 2003    (KR) .................... 10-2003-0051660

(51) Int. Cl.
 *H01L 29/04*    (2006.01)
(52) U.S. Cl. ................ 257/72; 257/59; 257/83; 257/368; 257/E31.082
(58) Field of Classification Search ........... 257/184, 257/187, 257, 290, 443, 57, 59, 72, 83, 351, 257/368
See application file for complete search history.

(56) References Cited

U.S. PATENT DOCUMENTS

| | | | | | |
|---|---|---|---|---|---|
| 5,827,409 | A * | 10/1998 | Iwata et al. | ............ | 204/192.15 |
| 6,421,101 | B1 * | 7/2002 | Zhang et al. | .................. | 349/39 |
| 6,468,822 | B2 * | 10/2002 | Maeda et al. | ................ | 438/30 |
| 6,825,071 | B2 * | 11/2004 | Suzawa et al. | .............. | 438/158 |
| 6,841,803 | B2 * | 1/2005 | Aizawa et al. | ................ | 257/98 |
| 2001/0005238 | A1 * | 6/2001 | Yun et al. | ..................... | 349/43 |
| 2003/0020852 | A1 * | 1/2003 | Chang et al. | ................ | 349/110 |
| 2003/0116765 | A1 * | 6/2003 | Koo et al. | ..................... | 257/59 |

FOREIGN PATENT DOCUMENTS

| | | |
|---|---|---|
| CN | 1429056 | 7/2003 |
| JP | 9-90425 | 4/1997 |
| KR | 1020010085187 | 12/2001 |

* cited by examiner

*Primary Examiner*—Wai-Sing Louie
(74) *Attorney, Agent, or Firm*—H.C. Park & Associates, PLC (57) ABSTRACT

An organic light emitting device that improves contrast by forming a gate wiring and a data wiring of a black matrix with a concentration gradient between a conductive material of high transmittance and a conductive material of high reflectivity. The organic light emitting device according to the present invention comprises a gate wiring and a data wiring formed on an insulating substrate, a pixel portion formed by the gate wiring and the data wiring, and a pixel arranged in the pixel portion, wherein at least one of the gate wiring and the data wiring is formed of a conductive light-absorbing material. At least one of the wirings is formed of a light-absorbing material with the concentration gradient between the conductive material of the high transmittance and the conductive material of the high reflectivity. The conductive material of the high reflectivity is composed of at least one of Al, Mo, Ti, Cu, Ag, or similar material, and the conductive material with high transmittance is composed of at least one of ITO, IO, TO, IZO, ZnO or similar material. The gate wiring includes a gate line, a gate electrode of a thin film transistor, a capacitor electrode, or a power line, and the data wiring includes a data line, source and drain electrodes of the thin film transistor, the capacitor electrode, or the power line.

34 Claims, 6 Drawing Sheets

FLAT PANEL DISPLAY

CROSS-REFERENCE TO RELATED APPLICATION

This application claims the benefit of Korean Patent Application No. 2003-51660, filed Jul. 25, 2003, the disclosure of which is incorporated herein by reference in its entirety.

FIELD OF THE INVENTION

The present invention relates to a flat panel display and, more particularly, to an organic light emitting device that improves contrast by forming a data wiring and a gate wiring of a black matrix with a concentration gradient between a transparent conductive material and a high-reflective metal material.

BACKGROUND OF THE INVENTION

Figure 1:
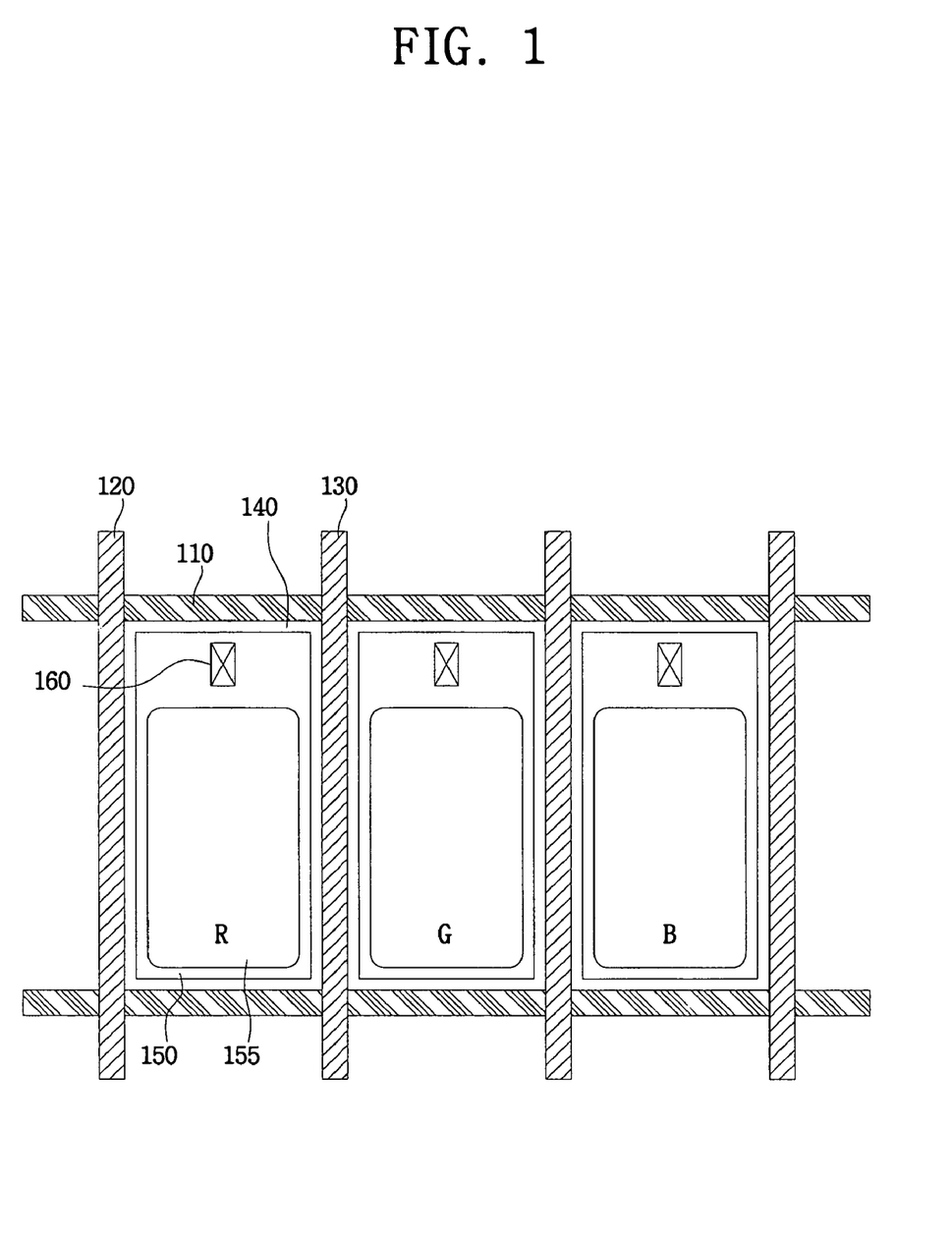
FIG. 1 is a layout diagram of a conventional organic light emitting device.

FIG. 1 shows a plan structure of a conventional active matrix organic light emitting device (AMOLED), focusing on a pixel consisting of red (R), green (G) and blue (B) unit pixels.

Referring to FIG. 1, the conventional AMOLED includes a plurality of gate lines 110 insulated from each other and arranged in a direction, a plurality of data lines 120 insulated from each other and arranged in a direction crossing with the gate lines 110, and a power line 130 crossing with the gate lines 110, arranged in parallel with the data lines 120 and insulated from each other. The AMOLED also includes, a plurality of pixel portions 140 formed by the gate lines 110, the data lines 120 and the power line 130, and a plurality of pixel electrodes 150 having an opening 155 arranged in each of the pixel portions 140.

Though not shown in the drawings, R, G and B unit pixels are arranged in each of the pixel portions 140, and each pixel unit includes a thin film transistor, a capacitor and an electroluminescence (EL) device coupled to the pixel electrode 150. A via hole 160 connects the pixel electrode 150 with one of the source electrode and the drain electrode of the thin film transistor.

The conventional organic light emitting device having a plan structure described above may have a problem with decreased contrast when the EL device emits light, since exterior light is reflected by metal materials, such as a gate electrode, the source and drain electrodes of the thin film transistor, a capacitor electrode, and other wiring. A mobile display which is extensively exposed to exterior light may have a problem of decreased contrast due to the high reflectivity of the exterior light.

In order to prevent the decreased contrast by reflection of the exterior light, a polarizer may be attached to the front surface of the display. However, using the polarizer may result in increased production cost, as well as decreased transmittance that degrades the contrast, because the polarizer itself shields light emitted from the organic emission layer.

Alternatively, a black matrix composed of Cr/CrOx, or an organic layer, is separately formed on an area in which the TFT and the capacitor are formed. A separate mask process may be required, however, to form the black matrix, making the manufacturing process relatively complicated.

When the contrast is improved by decreasing the reflectivity based on the exterior light, it may be important to more strenuously implement black than white. Korean patent application No. 2001-0085187 has disclosed a technique with which the black matrix is formed by using a concentration gradient layer (MIHL, metal insulator hybrid layer) in the active matrix organic light emitting device of a bottom-emitting type. However, this technique requires a separate process to form the black matrix.

SUMMARY OF THE INVENTION

An exemplary embodiment of the present invention provides an organic light emitting device that may improve contrast by minimizing reflectivity of exterior light.

A further exemplary embodiment of the present invention provides an organic light emitting device which does not require a separate black matrix by forming a gate wiring and a data wiring of materials with a concentration gradient between a transparent conductive material and a metal material.

An additional exemplary embodiment of the present invention provides a thin film transistor including a semiconductor layer formed on an insulating substrate, a gate electrode, and a source electrode and a drain electrode connected to the semiconductor layer, wherein at least one of the gate electrode and the source electrode and the drain electrode is formed of a conductive light-absorbing material. Also, at least one of the gate wiring and the data wiring of the organic light emitting device may comprise the conductive light-absorbing material.

In another exemplary embodiment of the invention, the organic light emitting device is of a bottom-emitting type. At least one of the electrodes may be formed of the concentration gradient layer in which the content of the transparent conductive material gradually increases toward the substrate while the content of the metal material gradually increases away from the substrate. The pixel may comprise a transistor, a capacitor and an EL device. The gate wiring may include at least one selected from a gate line, a gate electrode of the transistor, a capacitor electrode and a power line, and the data wiring may include at least one selected from a data line, a source electrode and a drain electrode of the transistor, a capacitor electrode and a power line. Each of the gate wiring and the data wiring may be formed on the substrate, except for an area of the substrate where light is emitted from the EL device, and further comprises a light-absorbing material pattern formed so as to be electrically separated from the gate wiring.

In an exemplary embodiment of a top-emitting type organic light emitting device, the concentration gradient layer may be such that the content of the metal material gradually increases toward the substrate while the content of the transparent conductive material gradually increases away from the substrate.

In an exemplary embodiment of a double-side-emitting type organic light emitting device, at least one of the electrodes may be formed of the concentration gradient layer in which the content of the metal material gradually increases toward a central part thereof while the content of the transparent conductive material gradually increases away from the central part toward the substrate and a counter part of the substrate.

BRIEF DESCRIPTION OF THE DRAWINGS

The above and other features and advantages of the present invention will become more apparent to those of ordinary skill in the art by describing in detail preferred embodiments thereof with reference to the attached drawings.

DETAILED DESCRIPTION OF THE INVENTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these exemplary embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2A:
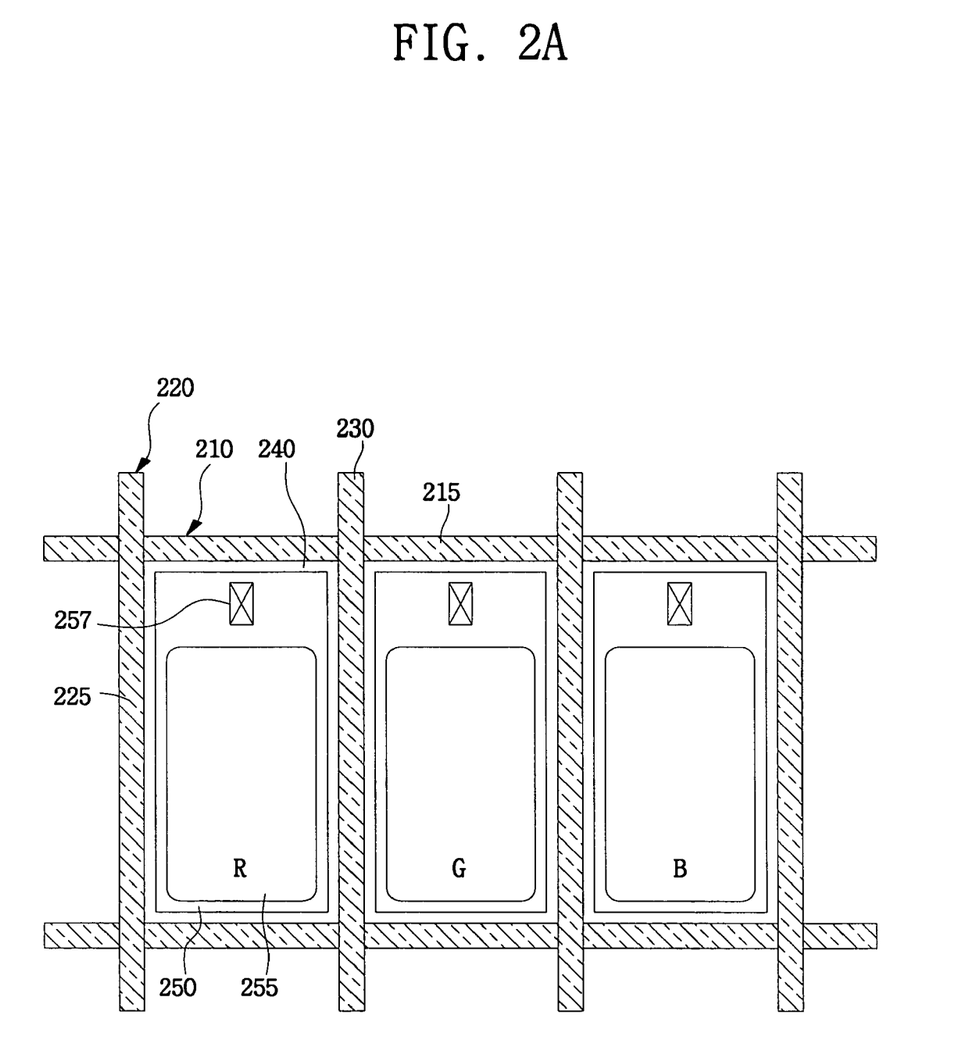
FIG. 2A is a layout diagram of an organic light emitting device according to an embodiment of the present invention.
Figure 2B:
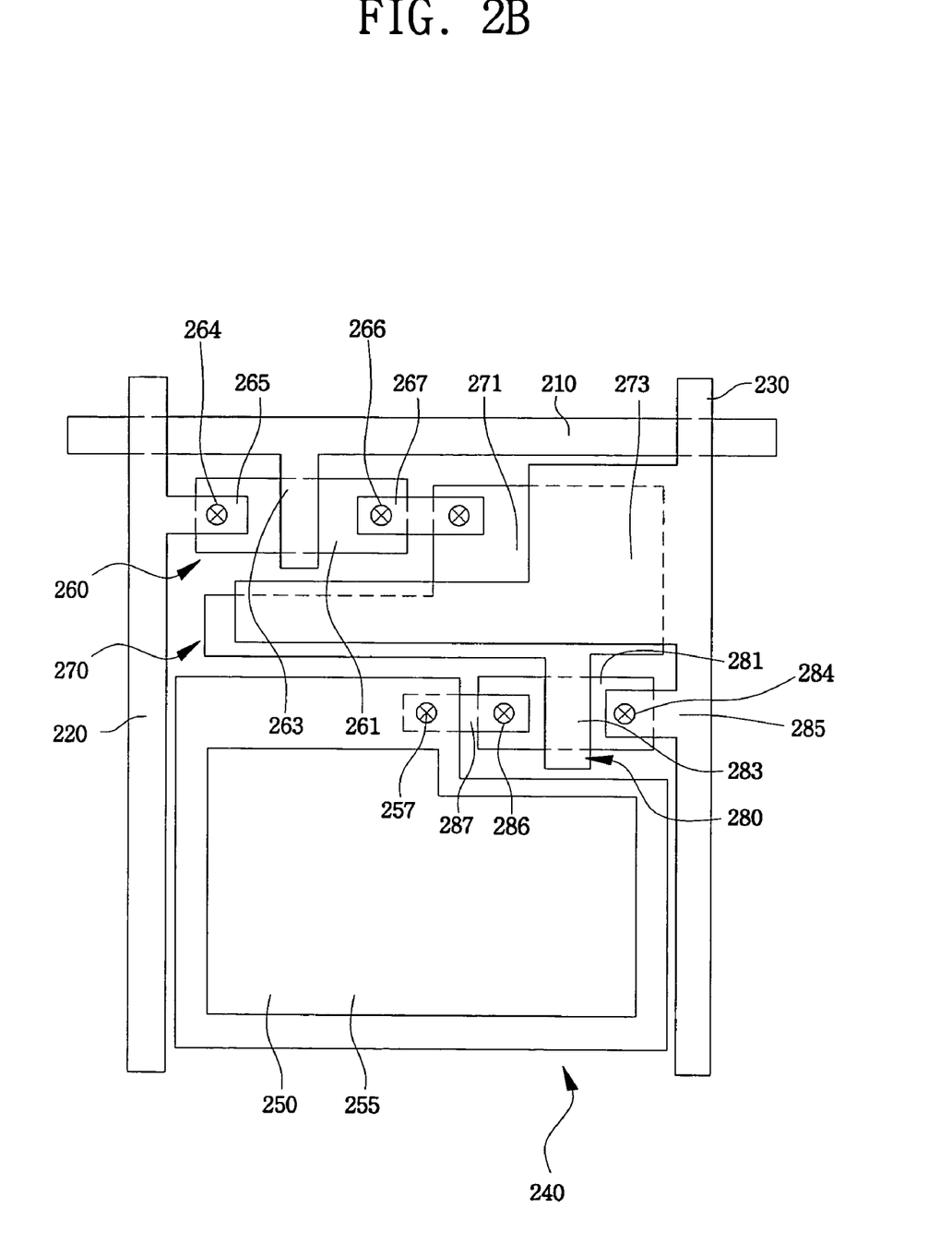
FIG. 2B is a layout diagram of a unit pixel in an organic light emitting device according to an embodiment of the present invention.

FIG. 2A is a schematic plan diagram of an organic light emitting device according to an exemplary embodiment of the present invention, where a pixel has R, G and B unit pixels. FIG. 2B is an example of a plan structure regarding one unit pixel in the organic light emitting device of FIG. 2B.

Referring to FIGS. 2A and 2B, an active matrix organic light emitting device (AMOLED) according to an exemplary embodiment of the present invention comprises a plurality of gate lines 210 insulated from each other and arranged in a direction, and a plurality of data lines 220 insulated from each other and arranged in a direction crossing the gate lines 210. Further, a power line 230 crosses the gate lines 210 and is arranged in parallel with the data lines 220 and insulated from each other. In addition, an AMOLED may comprise a plurality of pixel areas 240 formed by the gate lines 210, the data lines 220 and the power line 230. The gate lines 210, the data lines 220 and the power line 230 may be formed of a light-absorbing material with a concentration gradient between a metal material and a transparent conductive material.

R, G and B unit pixels are arranged in each of the pixel electrodes 250. Each pixel includes two thin film transistors 260 and 280, a capacitor 270 and an EL device having the pixel electrode 250.

The thin film transistor 260, which may be used for switching, may include a semiconductor layer 261 having source and drain areas, a gate electrode 263 connected to the gate line 210 and formed of a light-absorbing material with a concentration gradient between a metal material and a transparent conductive material. The thin film transistor 260 may further include a source electrode 265 and a drain electrode 267 connected to the source and drain areas of the semiconductor layer 261 through contact holes 264 and 266, respectively, and formed of a light-absorbing material with a concentration gradient between a metal material and a transparent conductive material.

The thin film transistor 280, which may be used for driving, may include a semiconductor layer 281 having source and drain areas, and a gate electrode 283 formed of a light-absorbing material with a concentration gradient between a metal material and a transparent conductive material. The thin film transistor 280 may further include source electrode 285 and a drain electrode 287 connected to the source and drain areas of the semiconductor layer 281 through contact holes 284 and 286, respectively. They are formed of a light-absorbing material with a concentration gradient between a metal material and a transparent conductive material.

The capacitor 270 may include a lower electrode 271, connected to the drain electrode 267 of the switching transistor 260 through a contact hole 268 and the gate electrode 283 of the driving transistor 280, and formed of a light-shield material with a concentration gradient between a metal material and a transparent conductive material. The capacitor 270 may further include an upper electrode 273 connected to the power line 230 and formed of a light-absorbing material with a concentration gradient between a metal material and a transparent conductive material. The pixel electrode 250 is connected to the drain electrode 287 of the driving transistor 280 through a via hole 257. The source electrode 285 of the driving transistor 280 is connected to the power line 230.

The AMOLED of an exemplary embodiment of the present invention having a structure described above may be formed of a light-absorbing material to protect the gate wiring and the data wiring from exterior light. As the light-shielding layer for the gate wiring and the data wiring, a thin film with a concentration gradient is employed with at least one metal material selected from Al, Mo, Cu, Ti, Ag or similar material with high reflectivity and at least one transparent conductive material selected from ITO, IZO, ZnO, IO, TO or similar material with high transmittance.

A concentration gradient layer (such as a MIHL, metal insulator hybrid layer) may be a thin film of a light absorbing material between the metal material and the transparent conductive material. The concentration between the metal material and the transparent conductive material may be continuously varied so as to continuously change a refractive index. Alternately, the concentration may be varied discontinuously. A concentration gradient layer may be a black matrix layer whose optical density is greater than 4, in which the layer absorbs incident light by scattering and does not reflect the light The concentration gradient layer is not limited to use as a wiring. The concentration gradient layer may include a metal material and a transparent conductive material, so that it has conductivity, and also may act as a black matrix, since it prevents exterior light from being reflected by shielding light incident from the exterior.

The wiring may be formed of the concentration gradient layer, whose content of the transparent conductive material and the metal material continuously varies according to a depth from the wiring's surface, so that the content of the transparent material gradually increases in a same direction as the light emitted from an organic thin-film layer of the EL device, while the content of the metal material gradually increases in an opposite direction of the emitting light.

The wiring may be embodied with a concentration gradient layer in which the content of the transparent conductive material gradually increases toward the substrate 200, while the content of the metal material gradually increases away from the substrate 200. Alternatively, the wiring may be embodied with a concentration gradient layer in which the content of the metal material gradually increases toward the substrate 200, while the content of the transparent conductive material gradually increases away from the substrate 200. Further, the wiring may also be embodied with a concentration gradient layer in which the content of the metal material gradually increases toward a central part thereof, while the content of the transparent conductive material gradually increases toward each of both sides.

The gate wiring may be the gate line 210 and the gate electrode 263, 283, as well as a corresponding electrode between the lower electrode 271 and the upper electrode 273 of the capacitor 270, such as, for example, the lower electrode 271 of the capacitor 270 when the lower electrode 271 is formed of the same material as the gate electrode. Additionally, when the power line 230 is simultaneously formed with the gate electrode, the gate wiring may include the power line 230 as well.

The data wiring may be the data line 220 and the source electrode 265 and the drain electrode 267, as well as a corresponding electrode between the lower electrode 271 and the upper electrode 273 of the capacitor 270, such as, for example, the upper electrode 273 of the capacitor 270 when the upper electrode 271 is formed of the same material as the source and drain electrodes. Additionally, when the power line 230 is simultaneously formed with the source and drain electrodes, the data wiring may include the power line 230 as well.

Figure 3:
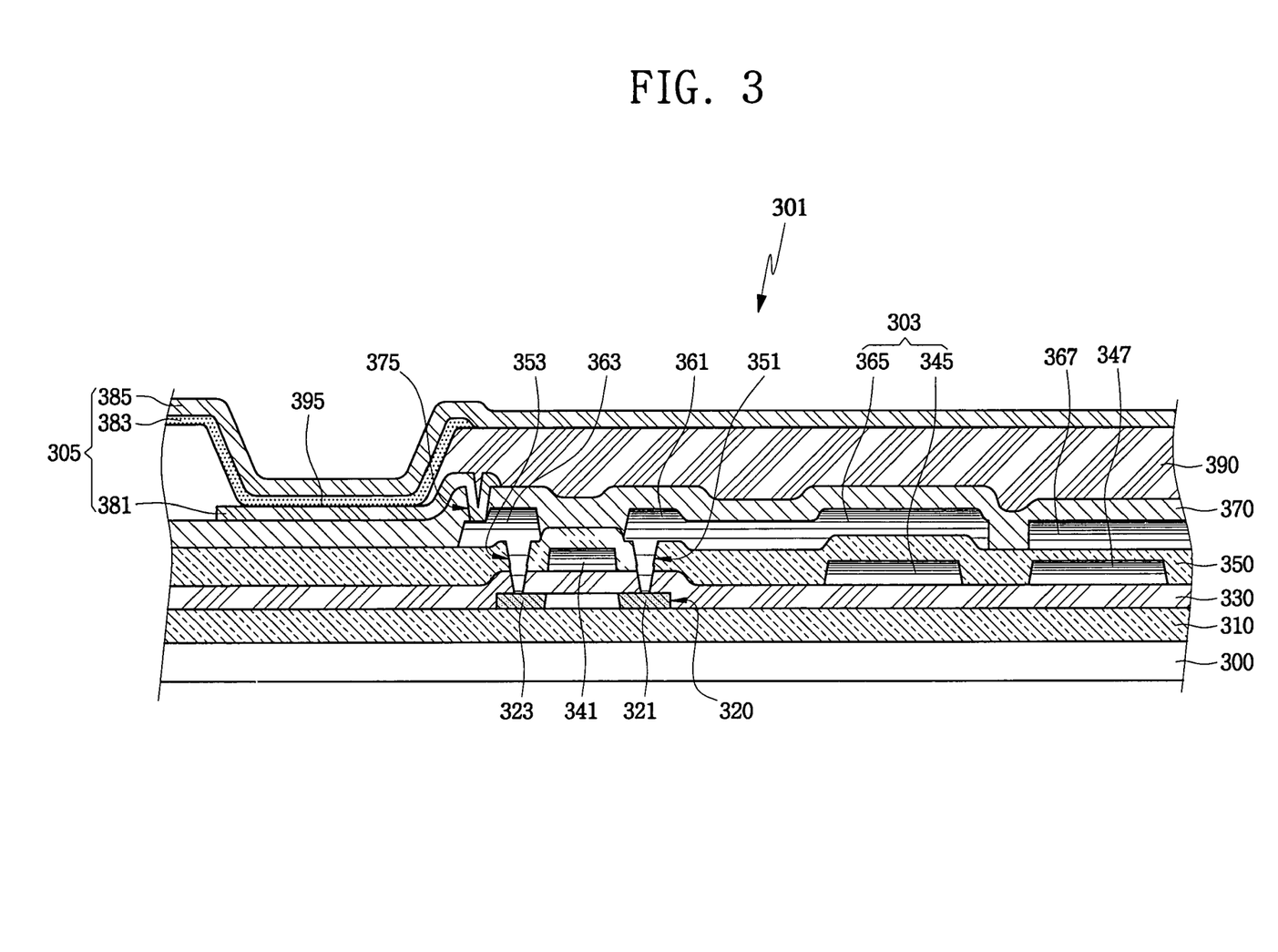
FIG. 3 is a cross-sectional structure of a bottom-emitting organic light-emitting device according to an embodiment of the present invention.

FIG. 3 shows a cross-sectional structure of an organic light emitting device of a bottom-emitting type according to an embodiment of the present invention. It includes an EL device, a capacitor, a gate line, a data line and a thin film transistor connected to the EL device.

Referring to FIG. 3, the thin film transistor 301 includes a semiconductor layer having a source area 321 and a drain area 323 on a buffer layer 310 of an insulating substrate 300, and a gate electrode 341 formed on a gate insulating layer 330. Source electrode 361 and drain electrode 363 are formed on an interlayer insulating layer 350 and connected with the source area 321 and the drain area 323 through respective contact hole 351 and 353.

The capacitor 303 includes a lower electrode 345 formed simultaneously with the gate electrode 341 on the gate insulating layer 330, and an upper electrode 365 formed simultaneously with source and drain electrodes 361 and 365 on the interlayer insulating layer 350. A gate line 347 may be simultaneously formed with the gate electrode 341 on the gate insulating layer 330, and a data line 367 may be simultaneously formed with the source and drain electrodes 361 and 365 on the interlayer insulating layer 350. Though not shown in the drawings, the power line 230 may be simultaneously formed with the data line herein, even though it also may be simultaneously formed with the gate line or the data line.

The EL device 305 includes a lower electrode 381, which may be a transmissive electrode formed on a passivation layer 370 and coupled with one of the source and drain electrodes 361 and 363 of the thin film transistor 301, such as, for example, the drain electrode 363 through a via hole 375. The EL device also may include an organic thin-film layer 383 formed on an opening 395 defined by a pixel defining layer 390 in the lower electrode 381, and an upper electrode 385 formed on an entire surface of the substrate.

An organic light emitting device according to an exemplary embodiment has a bottom-emitting structure in which light is emitted from the substrate 300. The gate wiring includes the gate electrode 341, the lower electrode 345 of the capacitor and the gate line 347, and the data wiring includes the source and drain electrodes 361 and 363, the upper electrode 365 of the capacitor, the data line 367 and the power line. The gate wiring and the data wiring may have a concentration gradient layer between a metal material and a transparent conductive material in which the content of the transparent conductive material gradually increases toward the substrate from which light is emitted while the content of the metal material gradually increases away from the substrate 300.

In an embodiment of the present invention, the gate wiring, including the gate electrode 341, the gate line 347 and the lower electrode 345 of the capacitor, may be formed by depositing and patterning a gate electrode material on the entire surface of the substrate. The data wiring, including the source and drain electrodes 361 and 363, the upper electrode 365 of the capacitor and the data line 367, may be formed by depositing and patterning source and drain electrode material on the entire surface of the substrate.

In another embodiment, the gate electrode material is deposited on the entire surface of the substrate and may be patterned, so that the gate electrode material may remain on the gate insulating layer 330 while the gate wiring is being patterned, except at an emitting area of the substrate through which light is emitted from the organic thin-film layer 383. When the source and drain electrode material is deposited on the entire surface of the substrate, the source and drain electrode material may be patterned to remain on the interlayer insulating layer 350 while the data wiring is being patterned, except for the emitting area of the substrate through which light is emitted from the organic thin-film layer 383.

Accordingly, the gate wiring may act as a wiring as well as a black matrix for shielding light, and a gate electrode material pattern that remains on an area, except for the emitting area, may act as a black matrix layer for shielding light. The data wiring may act as a wiring as well as a black matrix for shielding light, and a source and drain electrode material pattern that remains on an area, except for the emitting area, may act as a black matrix layer for shielding light.

Therefore, the black matrix layer electrically separated from the wirings may be formed without an additional mask process, and the light-shielding effect may be improved. In a bottom-emitting type organic light emitting device, the remaining gate electrode material pattern and source and drain electrode material pattern may be formed on an area, except for the emitting area, as well as electrically separated from the gate wiring and the data wiring, respectively.

Figure 4:
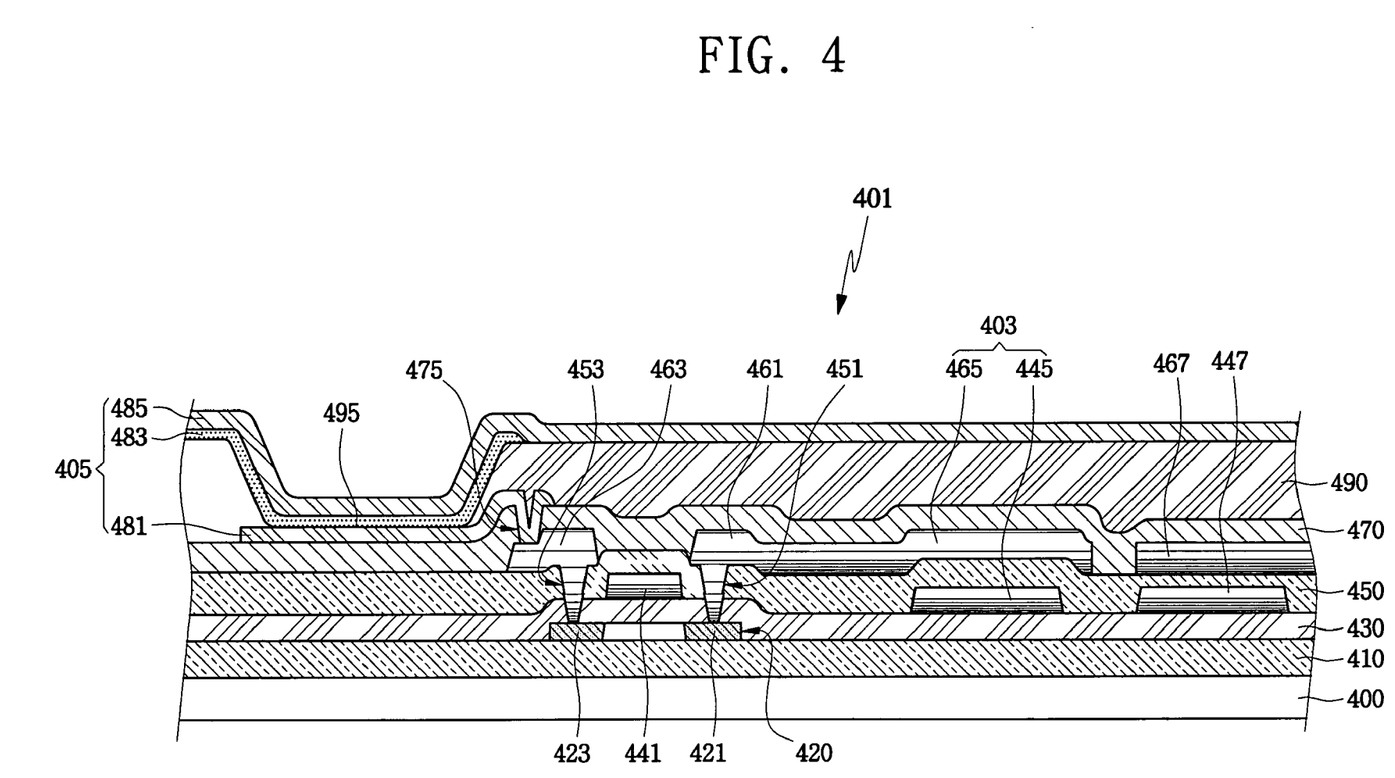
FIG. 4 is a cross-sectional structure of a top-emitting organic light emitting device according to an embodiment of the present invention.

FIG. 4 shows a cross-sectional structure of a top-emitting organic light emitting device, according to an embodiment of the present invention. It comprises an EL device, a capacitor, a gate line, a data line and a thin film transistor coupled to the EL device. The organic light emitting device shown in FIG. 4 may be substantially the same, structurally, as that of the exemplary embodiment described above, except for the structure of the concentration gradient layer of the wiring and that an upper electrode 485 may be formed of a transmissive electrode.

An organic light emitting device according to an exemplary embodiment has a top-emitting structure in which light is emitted through the upper electrode 485, which is transmissive. The gate wiring may include a gate electrode 441, a lower electrode 445 of the capacitor and a gate line 447, and the data wiring may include source electrode 461 and drain electrode 463, an upper electrode 465 of the capacitor, a data line 467 and a power line. The gate wiring and the data wiring may have a concentration gradient layer between a metal material and a transparent conductive material in which the content of the transparent conductive material gradually increases in a direction of the emitting light, that is, away from a substrate 400, while the content of the metal material gradually increases toward the substrate 400.

This embodiment may also increase the light-shielding effect by forming a black matrix layer for shielding light which is electrically separated from the wirings. In a top-emitting type, organic light emitting device, the remaining gate electrode material pattern and source and drain electrode material pattern may be electrically separated from the gate wiring and the data wiring on the substrate including the emitting area, respectively.

Figure 5:
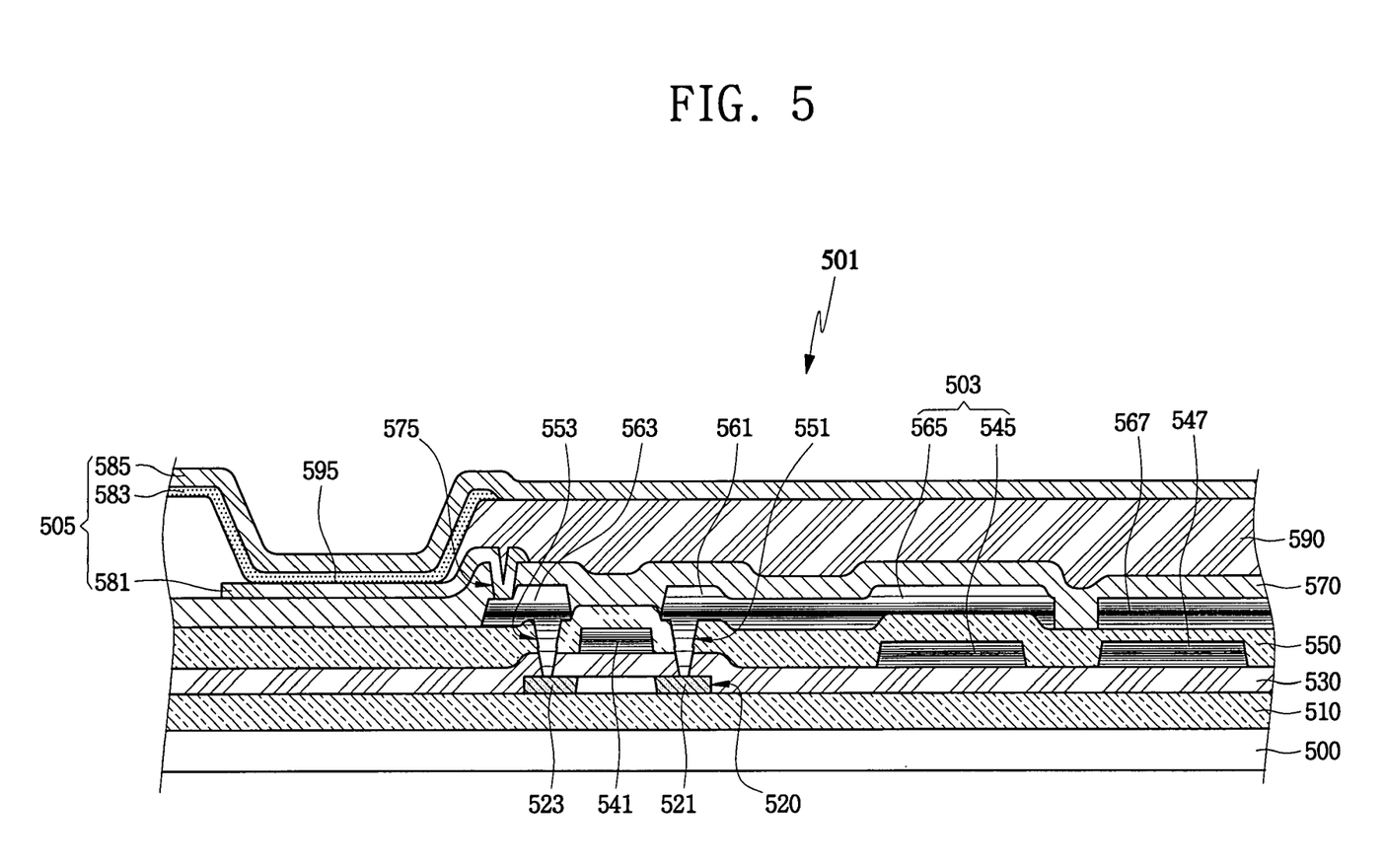
FIG. 5 is a cross-sectional structure of a double-side-emitting organic light emitting device according to an embodiment of the present invention.

FIG. 5 shows a cross-sectional structure of a double-side-emitting organic light emitting device according to an embodiment of the present invention, with an EL device, a capacitor, a gate line, a data line and a thin film transistor coupled to the EL device. The organic light emitting device shown in FIG. 5 may be substantially the same, structurally, as that of the embodiments described above, except for the structure of the concentration gradient layer of the wiring and that both an upper electrode 585 and a lower electrode 581 may be transmissive.

In a double-side-emitting organic light emitting device according to an embodiment of the invention, light is emitted from double sides through the upper electrode 585 and the lower electrode 581, which are the transmissive electrodes. The gate wiring may include a gate electrode 541, a lower electrode 545 of the capacitor and a gate line 547. Further, the data wiring may include source electrode 561 and drain electrode 563, an upper electrode 565 of the capacitor, a data line 567 and a power line. The gate wiring and the data wiring may have a concentration gradient layer between a metal material and a transparent conductive material in which the content of the metal material gradually increases toward a central part thereof, while the content of the transparent conductive material gradually increases toward a direction of the emitting light, that is, a direction from the central part to the substrate 500 and a direction from the central part to the upper electrode 585.

An embodiment of the invention may also increase the light-shielding effect by forming, along with the gate wiring and the data wiring, a black matrix layer acting as a light shield which may be electrically separated from the wirings. In a double-side-emitting organic light emitting device, the remaining gate electrode material pattern and source and drain electrode material pattern may be electrically separated from the gate wiring and the data wiring on the substrate, except the emitting area.

In exemplary embodiments of the present invention, the gate wiring and the data wiring may be formed of a light-absorbing material with a concentration gradient as described above by co-sputtering the metal material and the transparent conductive material.

In exemplary embodiments of the present invention, the data wiring and the gate wiring may be formed by a black matrix material with a concentration gradient between the metal material and the transparent conductive layer, and the conductive layer reflecting exterior light also may be formed by the black matrix material to prevent reflection of the exterior light. This may be applicable to an organic light emitting device having various structures without necessarily restricting to the structure where each of the pixels has a plan view, such as, for example, shown in FIG. 2B.

The exemplary embodiments of the present invention are explained as an example where the gate line and the lower electrode of the capacitor are simultaneously formed with the gate electrode while the data line, the upper electrode of the capacitor and the power line are simultaneously formed with the source and drain electrodes. However, the present invention also may be applicable to the gate line, the data line, the upper and lower electrodes of the capacitor and the power line being separately, and not simultaneously, formed with the gate electrode and the source and drain electrodes.

According to an exemplary embodiment of the present invention, such as described above, forming the gate wiring and the data wiring of the light-absorbing material with the concentration gradient between the metal material and the transparent conductive material may cause the reflection of exterior light by the wirings to be reduced to improve the contrast. Also, since a separate light-shielding layer is not required, the process may be simplified.

Although the present invention described so far is explained referring to exemplary embodiments, those of ordinary skill in the art will understand that the embodiments of the present invention described herein may easily by modified and altered in various ways to conform to their purposes without being distracted from the spirit and the scope of the present invention detailed and clarified in the following claims.

What is claimed is:

1. A thin film transistor, comprising:
    a semiconductor layer formed on a substrate;
    a gate electrode; and
    a source electrode and a drain electrode connected to the semiconductor layer,
    wherein at least one of the gate electrode, the source electrode, and the drain electrode includes a conductive light-absorbing material, wherein the conductive light-absorbing material comprises a metal material and a transparent conductive material,
    wherein the at least one of the electrodes is formed of a concentration gradient layer with a concentration gradient between the metal material and the transparent conductive material.

2. The thin film transistor according to claim 1, wherein a content of the transparent conductive material gradually increases toward the substrate while a content of the metal material gradually increases away from the substrate.

3. The thin film transistor according to claim 1, wherein a content of the metal material gradually increases toward the substrate while a content of the transparent conductive material gradually increases away from the substrate.

4. The thin film transistor according to claim 1, wherein a content of the metal material gradually increases toward a central part thereof while a content of the transparent conductive material gradually increases away from the central part toward the substrate.

5. The thin film transistor according to claim 1, wherein the metal material includes at least one material selected from the group consisting of Al, Mo, Cu, Ti and Ag.

6. The thin film transistor according to claim 1, wherein the concentration gradient varies continuously.

7. The thin film transistor according to claim 1, wherein the concentration gradient varies discontinuously.

8. An organic light emitting device, comprising:
    a gate wiring and a data wiring formed on an insulating substrate;
    a pixel portion formed by the gate wiring and the data wiring; and
    a pixel arranged in the pixel portion,
    wherein at least one of the gate wiring and the data wiring is formed of a concentration gradient layer with a concentration gradient between a transparent conductive material and a metal material, and wherein the transparent conductive material includes at least one material selected from the group consisting of ITO, IO, TO, IZO and ZnO.

9. The organic light emitting device according to claim 8, wherein a content of the transparent conductive material gradually increases in a same direction as a direction in which light is emitted.

10. The organic light emitting device according to claim 8, wherein the organic light emitting device is of a bottom-emitting type, and
a content of the transparent conductive material gradually increases toward the substrate while a content of the metal material gradually increases away from the substrate.

11. The organic light emitting device according to claim 10, wherein the pixel comprises a transistor, a capacitor and an EL device, and
the gate wiring includes at least one of a gate line, a gate electrode of the transistor, a capacitor electrode and a power line.

12. The organic light emitting device according to claim 11, further comprising a light-absorbing material pattern formed on the substrate, except for an area in which light is emitted from the EL device, where the light-absorbing material pattern is electrically separated from the gate wiring.

13. The organic light emitting device according to claim 10, wherein the pixel comprises a transistor, a capacitor and an EL device, and the data wiring includes at least one of a data line, a source electrode of the transistor, a drain electrode of the transistor, a capacitor electrode and a power line.

14. The organic light emitting device according to claim 13, further comprising a light-absorbing material pattern formed on the substrate, except for an area in which light is emitted from the EL device, where the light-absorbing material pattern is electrically separated from the data wiring.

15. The organic light emitting device according to claim 8, wherein the organic light emitting device is of a top-emitting type, and a content of the metal material gradually increases toward the substrate while a content of the transparent conductive material gradually increases away from the substrate.

16. The organic light emitting device according to claim 15, wherein the pixel comprises a transistor, a capacitor and an EL device, and the gate wiring includes at least one of a gate line, a gate electrode of the transistor, a capacitor electrode and a power line.

17. The organic light emitting device according to claim 16, further comprising a light-absorbing material pattern formed on the substrate including an area in which light is emitted from the EL device, where the light-absorbing material pattern is electrically separated from the gate wiring.

18. The organic light emitting device according to claim 15, wherein the pixel comprises a transistor, a capacitor and an EL device, and the data wiring includes at least one of a data line, a source electrode of the transistor, a drain electrode of the transistor a capacitor electrode and a power line.

19. The organic light emitting device according to claim 18, further comprising a light-absorbing material pattern formed on the substrate including an area in which light is emitted from the EL device, where the light-absorbing material pattern is electrically separated from the data wiring.

20. The organic light emitting device according to claim 8 wherein the organic light emitting device is of a double-side emitting type, and a content of the metal material gradually increases toward a central part thereof while a content of the transparent conductive material gradually increases away from the central part toward the substrate and a central part of the substrate.

21. The organic light emitting device according to claim 20, wherein the pixel comprises a transistor, a capacitor and an EL device, and the gate wiring includes at least one of a gate line, a gate electrode of the transistor, a capacitor electrode and a power line.

22. The organic light emitting device according to claim 21, further comprising a light-absorbing material pattern formed on the substrate, except for an area in which light is emitted from the EL device, where the light-absorbing material pattern in electrically separated from the gate wiring.

23. The organic light emitting device according to claim 20, wherein the pixel comprises a transistor, a capacitor and an EL device, and the data wiring includes at least one of a data line, a source electrode of the transistor, a drain electrode of the transistor, a capacitor electrode and a power line.

24. The organic light emitting device according to claim 23, further comprising a light-absorbing material pattern formed on the substrate, except for an area in which light is emitted from the EL device, where the light-absorbing material pattern is electrically separated from the data wiring.

25. The organic light emitting device according to claim 8, wherein the metal material includes at least one material selected from the group consisting of Al, Mo, Cu, Ti and Ag.

26. The organic light emitting device according to claim 8, wherein the concentration gradient varies continuously.

27. The organic light emitting device according to claim 8, wherein the concentration gradient varies discontinuously.

28. A thin film transistor, comprising:
a semiconductor layer formed on a substrate;
a gate electrode; and
a source electrode and a drain electrode connected to the semiconductor layer,
wherein at least one of the gate electrode, the source electrode, and the drain electrode includes a conductive light-absorbing material, wherein the conductive light-absorbing material comprises a metal material and a transparent conductive material, and wherein the transparent conductive material includes at least one material selected from the group consisting of ITO, IO, TO, IZO, and ZnO, and
wherein the at least one of the electrodes is formed of a concentration gradient layer with a concentration gradient between the metal material and the transparent conductive material.

29. The thin film transistor according to claim 28, wherein a content of the transparent conductive material gradually increases toward the substrate while a content of the metal material gradually increases away from the substrate.

30. The thin film transistor according to claim 28, wherein a content of the metal material gradually increases toward the substrate while a content of the transparent conductive material gradually increases away from the substrate.

31. The thin film transistor according to claim 28, wherein a content of the metal material gradually increases toward a central part thereof while a content of the transparent conductive material gradually increases away from the central part toward the substrate.

32. The thin film transistor according to claim 28, wherein the metal material includes at least one material selected from the group consisting of Al, Mo, Cu, Ti, and Ag.

33. The thin film transistor according to claim 28, wherein the concentration gradient varies continuously.

34. The thin film transistor according to claim 28, wherein the concentration gradient varies discontinuously.

* * * * *